United States Patent
Pyo et al.

(10) Patent No.: US 10,803,971 B2
(45) Date of Patent: Oct. 13, 2020

(54) DEVICE FOR SUPPORTING ERROR CORRECTION CODE AND TEST METHOD THEREOF

(71) Applicant: Samsung Electronics Co., Ltd., Suwon-si, Gyeonggi-do (KR)

(72) Inventors: Suk-soo Pyo, Hwaseong-si (KR); Hyun-taek Jung, Seoul (KR); Tae-joong Song, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 31 days.

(21) Appl. No.: 16/135,325

(22) Filed: Sep. 19, 2018

(65) Prior Publication Data
US 2019/0088349 A1    Mar. 21, 2019

(30) Foreign Application Priority Data

Sep. 21, 2017 (KR) .................. 10-2017-0121878
Feb. 20, 2018 (KR) .................. 10-2018-0020017

(51) Int. Cl.
| | | |
|---|---|---|
| *G11C 29/42* | (2006.01) | |
| *G06F 11/10* | (2006.01) | |
| *G11C 29/46* | (2006.01) | |
| *G06F 11/22* | (2006.01) | |
| *G11C 29/36* | (2006.01) | |
| *G11C 29/04* | (2006.01) | |

(52) U.S. Cl.
CPC .......... *G11C 29/42* (2013.01); *G06F 11/1044* (2013.01); *G06F 11/2215* (2013.01); *G11C 29/46* (2013.01); *G11C 29/36* (2013.01); *G11C 2029/0403* (2013.01)

(58) Field of Classification Search
CPC ......... G11C 29/42; G11C 29/46; G11C 29/36; G11C 2029/0403; G06F 11/1044; G06F 11/2215
See application file for complete search history.

(56) References Cited

U.S. PATENT DOCUMENTS 7,069,494 B2    6/2006    Cargnoni et al.
7,395,489 B2    7/2008    Itou et al.
(Continued)

OTHER PUBLICATIONS

Oh, T-Y., et al., "A 3.2 Gbps/pin 8 Gbit 1.0 V LPDDR4 SDRAM With Integrated ECC Engine for Sub-1 V DRAM Core Operation," IEEE Journal of Solid-State Circuits, vol. 50, Issue: 1, Jan. 2015, pp. 178-190.) (Year: 2015).*

*Primary Examiner* — Kyle Vallecillo
(74) *Attorney, Agent, or Firm* — Harness, Dickey & Pierce, P.L.C.

(57) ABSTRACT

A device for supporting a test mode for memory testing according to an example embodiment of the inventive concepts may include a memory configured to receive and store writing data and output reading data from the stored writing data; an error correction code (ECC) engine configured to generate the writing data by encoding input data and to generate output data by correcting error bits of N bits or less included in receiving data when N is a positive integer; and an error insertion circuit configured to provide the reading data to the ECC engine as the receiving data in a normal mode and to provide data obtained by inverting at least one bit of less than N bits of the reading data to the ECC engine as the receiving data in the test mode.

18 Claims, 13 Drawing Sheets

(56) References Cited

U.S. PATENT DOCUMENTS

| | | |
|---|---|---|
| 7,430,693 B2 | 9/2008 | Noguchi et al. |
| 8,255,758 B2 | 8/2012 | Anholt et al. |
| 8,301,972 B2 | 10/2012 | Tang |
| 8,509,003 B2 | 8/2013 | Lin et al. |
| 8,576,617 B2 | 11/2013 | Zhu et al. |
| 8,612,828 B2 | 12/2013 | Brzezinski |
| 8,644,060 B2 | 2/2014 | Abedifard et al. |
| 8,693,273 B2 | 4/2014 | Yuh et al. |
| 9,043,674 B2 | 5/2015 | Wu et al. |
| 9,444,496 B2 | 9/2016 | Manoochehri et al. |
| 9,620,191 B2 | 4/2017 | Pyo |
| 2005/0086572 A1* | 4/2005 | Hirabayashi ........ G06F 11/1008 714/758 |
| 2005/0240838 A1 | 10/2005 | Iwai |
| 2017/0063394 A1* | 3/2017 | Halbert ............... G06F 11/1068 |
| 2017/0261555 A1* | 9/2017 | Fee ................. G01R 31/31723 |
| 2017/0261557 A1* | 9/2017 | Fee .................... G01R 31/3177 |
| 2018/0189125 A1* | 7/2018 | Karlik ................ G06F 11/1048 |
| 2018/0203761 A1* | 7/2018 | Halbert ............... G06F 11/1068 |
| 2018/0331692 A1* | 11/2018 | Gulati ................ H03M 13/015 |
| 2019/0080111 A1* | 3/2019 | Patange ............. G06F 11/1012 |

* cited by examiner

DEVICE FOR SUPPORTING ERROR CORRECTION CODE AND TEST METHOD THEREOF

CROSS-REFERENCE TO RELATED APPLICATIONS

This application claims priority under 35 U.S.C. § 119 to Korean Patent Applications No. 10-2017-0121878, filed on Sep. 21, 2017, in the Korean Intellectual Property Office, and No. 10-2018-0020017, filed on Feb. 20, 2018, in the Korean Intellectual Property Office, the disclosures of which are incorporated herein in their entireties by reference.

BACKGROUND

The inventive concepts relates to devices for supporting an error correction code, and more particularly, to devices for supporting an error correction code and/or a test method thereof.

An error correction code (ECC) system may be used to correct errors that occur in data that has passed through a noisy channel. For example, the ECC system may be used to correct an error that occurs in data received over a communication channel, or may be used to correct an error that occurs in data read from a memory. According to the ECC system, a codeword to which redundancy is added to original data may be generated, and the original data may be recovered by correcting the error in the data that has passed through the noisy channel. The ECC system may have a correctable error amount, and the larger the correctable error amount, the more the resources to implement the ECC system, as well as redundancy added to an ECC may increase. Therefore, the amount of errors that may occur in the noisy channel may be limited to a range of an error amount that can be corrected by a given ECC system. For example, if the noisy channel is a memory in the ECC system, it may be required to verify whether the amount of errors that may occur in the memory is within the range of an error amount that can be corrected by the given ECC system.

SUMMARY

The inventive concepts provide devices for supporting an error correction code (ECC), and more particularly, devices for supporting an ECC for easily determining whether a noisy channel has a range of an error amount that can be corrected by an ECC system and/or a test method thereof.

According to an example embodiment, a device for supporting a test mode for memory testing may include: a memory configured to receive and store writing data and output reading data from the stored writing data; an error correction code (ECC) engine configured to generate the writing data by encoding input data and to generate output data by correcting error bits of N bits or less included in receiving data when N is a positive integer; and an error insertion circuit configured to provide the reading data to the ECC as the receiving data in a normal mode and to provide data obtained by inverting at least one bit of less than N bits of the reading data to the ECC engine as the receiving data in the test mode.

According to an example embodiment, a device for supporting a test mode for memory testing may include: a memory configured to receive and store writing data and output reading data from the stored writing data; an error correction code (ECC) engine configured to generate encoded data by encoding input data and to generate output data by correcting error bits of N bits or less included in the reading data when N is a positive integer; and an error insertion circuit configured to provide the encoded data to the memory as the writing data in a normal mode and to provide data obtained by inverting at least one bit of less than N bits of the encoded data to the memory as the writing data in the test mode.

According to an example embodiment, a method of testing a device comprising an error correction code (ECC) engine and a memory configured to correct error bits of N bits or less when N is a positive integer may include: generating writing data by encoding input data by the ECC engine; writing the writing data in the memory, reading the writing data, and outputting the reading data; and generating output data by correcting an error of the reading data by the ECC engine, wherein the writing of the writing data and the outputting of the reading data comprises inverting at least one bit of less than N bits in at least one of the writing data and the reading data.

BRIEF DESCRIPTION OF THE DRAWINGS

Example embodiments of the inventive concepts will be more clearly understood from the following detailed description taken in conjunction with the accompanying drawings in which.

DETAILED DESCRIPTION

Figure 1:
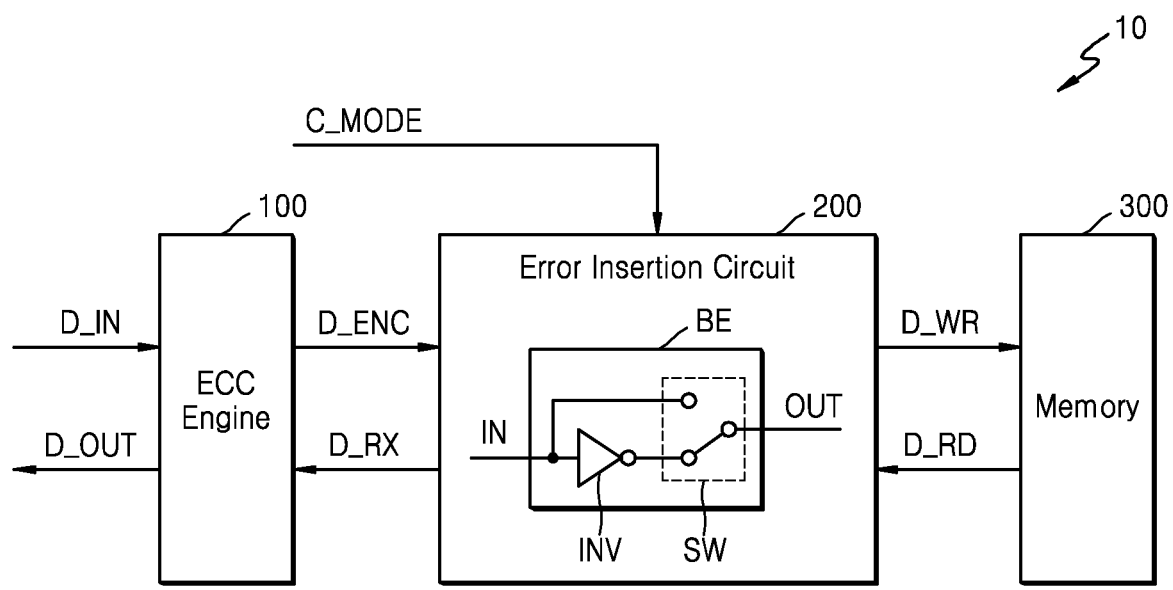
FIG. 1 is a block diagram of a device for supporting an error correction code (ECC), according to an example embodiment of the inventive concepts.

FIG. 1 is a block diagram of a device 10 for supporting an error correction code (ECC), according to an example embodiment of the inventive concepts. In more detail, FIG. 1 shows the device 10 including a memory 300 as a noisy channel in an ECC system. As shown in FIG. 1, the device 10 may include an ECC engine 100, an error insertion circuit 200, and/or the memory 300.

The device 10 may be any device 10 that includes the memory 300 for storing input data D_IN and using the stored data as output data D_OUT. In some example embodiments, the device 10 may be, but is not limited to, a system-on-chip (SoC) such as an application processor (AP). In some example embodiments, the device 10 may be, but is not limited to, a semiconductor memory device for storing the input data D_IN and outputting the output data D_OUT according to an external command, such as dynamic random access memory (DRAM), a flash memory, and the like. In some example embodiments, the device 10 may be, but is not limited to, a memory system for storing the input data D_IN and outputting the output data D_OUT in response to a host request, such as a solid state drive (SSD), a memory card, and the like.

The ECC engine 100 may generate encoded data D_ENC by encoding the input data D_IN and may generate the output data D_OUT by decoding receiving data D_RX. The memory 300 in the device 10 may be a noisy channel. For example, noise may occur, but is not limited to, due to defects in memory cells storing data in the memory 300, and/or due to a defect in a path on which writing data D_WR provided in the memory 300 moves or a path on which reading data D_RD output from the memory 300 moves. The device 10 may include the ECC engine 100, and the ECC engine 100 may generate the encoded data D_ENC by adding redundancy to the input data D_IN to be stored in the memory 300, and may generate the output data D_OUT by correcting errors based on redundancy in the receiving data D_RX received from the memory 300. In some example embodiments, the encoded data D_ENC may be provided to the memory 300 in units of codewords including a portion of the input data D_IN (or data generated therefrom) and redundancy.

The ECC engine 100 may perform encoding and decoding in various manners. For example, the ECC engine 100 may perform encoding and decoding based on, but is not limited to, an ECC such as AN code, BCH code, Hamming code, Polar code, Turbo code, and/or the like. In some example embodiments, The ECC engine 100 may include a processor and a memory for storing instructions executed by the processor, or may include a logic circuit designed by logic synthesis in some example embodiments.

The ECC engine 100 may have a correctable error amount. For example, when the ECC engine 100 is designed according to a 2-bit correction ECC system, the ECC engine 100 may detect and correct errors of less than or equal to 2 bits in the receiving data D_RX, for example, 1-bit error and 2-bit error. In some example embodiments, the ECC engine 100 may detect that the amount of errors in the receiving data D_RX exceeds the amount of errors that may be corrected by the ECC engine 100, or may generate a signal indicating that error correction is impossible.

As the error amount that can be corrected by the ECC engine 100 increases, redundancy added to the input data D_IN to generate the encoded data D_ENC may increase, and storage capacity of the memory 300 for storing the input data D_IN may decrease. Also, as the amount of errors that may be corrected by the ECC engine 100 increases, resources consumed by the ECC engine 100, such as area, power, and/or time may increase. Accordingly, the ECC engine 100 may be designed to have a correctable error amount, which is determined based on a noisy channel, that is, a bit error rate (BER) occurring in the memory 300. For example, when an expected BER of the memory 300 is 0.2 and a data unit processed by the ECC engine 100 is 10-bit data units, a correctable error amount of the ECC engine 100 may be designed to be 2 bits or more. When the ECC engine 100 has an N-bit correctable error amount (N>0), the ECC system may be referred to as an N-bit correction ECC system, and the ECC engine 100 may be referred to as the N-bit correction ECC engine 100.

The error insertion circuit 200 may selectively insert an error, according to a mode signal C_MODE, between the ECC engine 100 and the memory 300. As shown in FIG. 1, the error insertion circuit 200 may receive the encoded data D_ENC from the ECC engine 100 and provide the writing data D_WR to the memory 300. The error insertion circuit 200 may also receive the reading data D_RD from the memory 300 and provide the receiving data D_RX to the ECC engine 100. The mode signal C_MODE may indicate a mode of the device 10, and the device 10 may operate in a normal mode and a test mode according to the mode signal C_MODE. The error insertion circuit 200 may include a processor and a memory for storing instructions executed by the processor, or may include a logic circuit designed by logic synthesis in some example embodiments.

The error insertion circuit 200 may include at least one bit error circuit BE. The bit error circuit BE may receive an input signal IN indicating a value of one bit and may output an output signal OUT indicating a value of one bit. As shown in FIG. 1, the bit error circuit BE may include an inverter INV and a switch SW, and the output signal OUT may be the same as the input signal IN or may be the same as a signal obtained by inverting the input signal IN. In some example embodiments, the switch SW of the bit error circuit BE may be controlled based on the mode signal C_MODE input to the error insertion circuit 200. For example, when the mode signal C_MODE indicates a normal mode, the switch SW may be controlled such that the output signal OUT coincides with the input signal IN. For example, when the mode signal C_MODE indicates a test mode, the switch SW may be controlled such that the output signal OUT coincides with the signal obtained by inverting the input signal IN. When the output signal OUT coinciding with the input signal IN is output, the bit error circuit BE may be represented as being deactivated, and when the output signal OUT obtained by inverting the input signal IN is output, the bit error circuit BE may be represented as being activated.

The error insertion circuit 200 may use the bit error circuit BE to insert an error into data received by the error insertion circuit 200 in a test mode. In some example embodiments, the error insertion circuit 200 may generate the writing data D_WR by inserting at least one bit error into the encoded data D_ENC provided by the ECC engine 100, as described later below with reference to FIG. 2A, in response to the mode signal C_MODE indicating a test mode. In some example embodiments, in response to the mode signal C_MODE indicating the test mode, the error insertion circuit 200 may also generate the receiving data D_RX by inserting at least one bit error into the reading data D_RD provided from the memory 300 as described later below with reference to FIG. 2B. Furthermore, in some example embodiments, the error insertion circuit 200 may insert at least one bit error into the encoded data D_ENC and the reading data D_RD, respectively, in response to the mode signal C_MODE indicating the test mode.

As such, at least one bit error may be inserted by the error insertion circuit 200 in the test mode, and thus the memory 300 may be verified as acceptable or defective. Defects causing errors in the memory 300 may include not only an initial defect occurring during a manufacturing process of the memory 300 but also a sequential defect occurring during a period when the memory 300 or the device 10 including the memory 300 is shipped and/or used. Thus, during the manufacturing process of the memory 300 or the device 10, it may be verified whether or not the memory 300 has a certain error margin from an error amount correctable by the ECC engine 100. For example, when the ECC engine 100 corresponds to a 3-bit correction ECC system, the memory 300 may be manufactured to have a 1-bit error margin. Accordingly, the memory 300 may be normally used even if a 1-bit error occurs due to a defect in the memory 300. Therefore, in the manufacturing process of the memory 300 or the device 10, the memory 300 may be tested in order to ship only the memory 300 having a 2-bit error or less, that is, the memory 300 having a 1-bit error margin. That is, the memory 300 or the device 10 may be tested during the manufacturing process such that an error is corrected by ECC engine 100 for the 3-bit correction to cause no problem in the device 10 even if a 1-bit error occurs while the device 10 is used by a user.

The error insertion circuit 200 may artificially reduce the error amount of the ECC system correctable by the ECC engine 100 by inserting an error amount corresponding to the error margin of the memory 300. For example, when the device 10 includes the 3-bit correction ECC engine 100 and the error insertion circuit 200 inserts a 1-bit error, then the memory 300 may always be considered to contain a 1-bit error, and thus the device 10 may correspond to a 2-bit ECC system. In addition, in a test mode, the error insertion circuit 200 may insert an error between the ECC engine 100 and the memory 300 using the bit error circuit BE of a simple structure, as shown in FIG. 1. The acceptance or failure of the memory 300 or the device 10 may be determined depending on whether or not error correction by the ECC engine 100 is successful. For example, when the memory 300 is manufactured to have a 1-bit error margin, the error insertion circuit 200 may insert a 1-bit error in a test mode and determine whether the ECC engine 100 successfully corrects the error to test the memory 300 or the device 10. Thus, the memory 300 may be easily verified in the device 10 including the memory 300 and supporting ECC, and accordingly, productivity of the device 10 may be improved. Although FIG. 1 shows an example of the memory 300 as a noisy channel, it will be appreciated that an ECC system that provides an additional margin from an error amount predictable by a channel with other noise, for example, a communication channel, may be readily verified in accordance with example embodiments of the inventive concepts.

The memory 300 may receive and store the writing data D_WR and may output the reading data D_RD from the stored writing data D_WR. The memory 300 may include a plurality of memory cells for storing data. In some example embodiments, the memory 300 may include a nonvolatile memory (e.g., electrically erasable programmable read-only memory (EEPROM), a flash memory, phase change random access memory (PRAM), resistance random access memory (RRAM), nano floating gate memory (NFGM), polymer random access memory (PoRAM), magnetic random access memory (MRAM), or ferroelectric random access memory (FRAM)). In some example embodiments, the memory 300 may include a volatile memory (e.g., DRAM, static RAM, mobile DRAM, double data rate synchronous DRAM (DDR SDRAM), low power DDR (LPDDR) SDRAM, graphic DDR (GDDR) SDRAM, or rambus DRAM (RDRAM)).

Figure 2A:
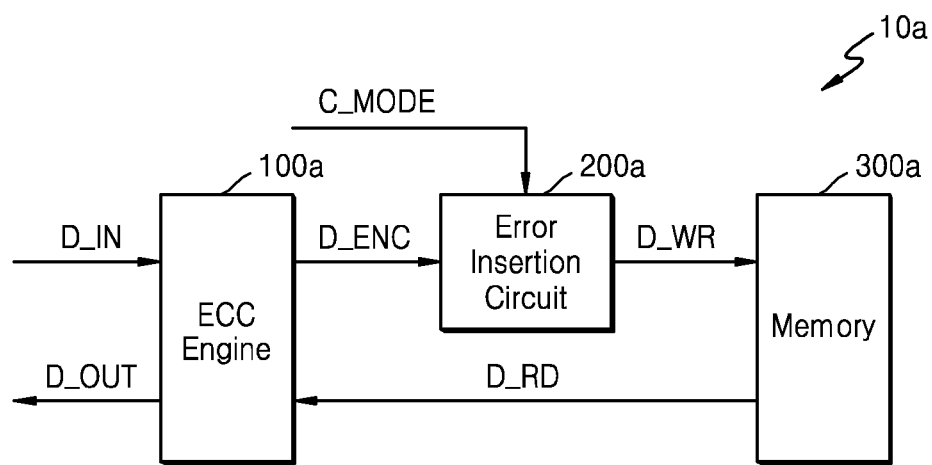
FIGS. 2A and 2B are block diagrams illustrating examples of the device of FIG. 1 according to an example embodiment of the inventive concepts.
Figure 2B:
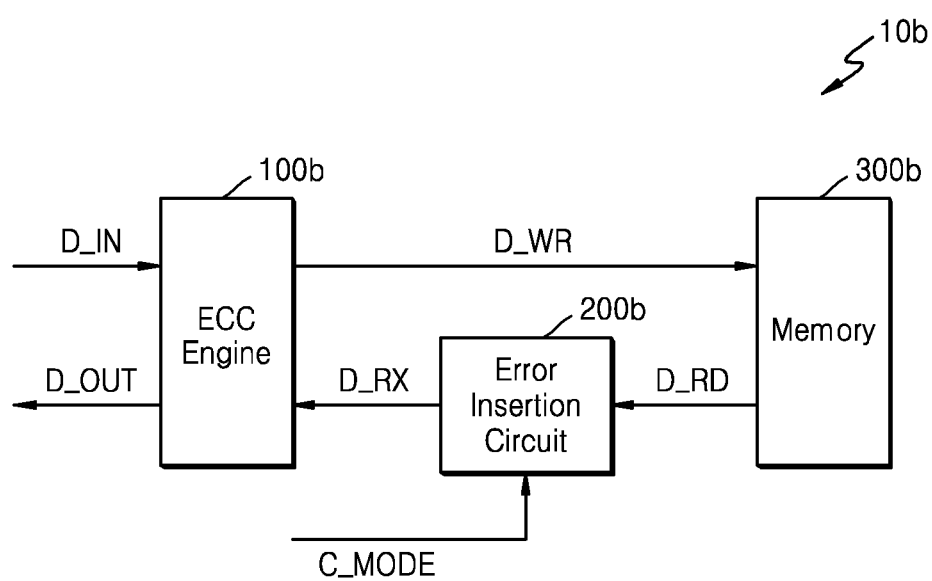

FIGS. 2A and 2B are block diagrams illustrating examples of the device 10 of FIG. 1 according to an example embodiment of the inventive concepts. As described above with reference to FIG. 1, devices 10a and 10b of FIGS. 2A and 2B may each support a normal mode and a test mode according to the mode signal C_MODE provided from the outside. Hereinafter, in FIGS. 2A and 2B, the same reference numerals as in FIG. 1 denote the same elements, and therefore, detailed descriptions thereof will not be given herein.

Referring to FIG. 2A, the device 10a may include an ECC engine 100a, an error insertion circuit 200a, and a memory 300a. The error insertion circuit 200a may provide the encoded data D_ENC provided from the ECC engine 100a in a normal mode to the memory 300a as the writing data D_WR, and/or may provide the writing data D_WR generated by inserting at least one bit error into the encoded data D_ENC to the memory 300a. The ECC engine 100a may receive the reading data D_RD output from the memory 300a and accordingly the reading data D_RD and the receiving data D_RX of FIG. 1 may coincide with each other in a test mode.

In a test mode, the input data D_IN may be stored in the memory 300a and then the output data D_OUT may be generated from the reading data D_RD output from the memory 300a. For example, after an operation of sequentially storing identical input data D_IN in the entire memory 300a is performed, the output data D_OUT may be generated from the reading data D_RD sequentially output from the entire memory 300a. In some example embodiments, the input data D_IN may be compared with the output data D_OUT generated by the ECC engine 100a, and when the input data D_IN and the output data D_OUT do not coincide with each other, the memory 300a may be determined to be defective. In some example embodiments, when the ECC engine 100a cannot correct an error of the reading data D_RD, that is, an error in the reading data D_RD exceeds an error amount correctable by the ECC engine 100a, the ECC engine 100a may output a signal indicating this. Further, the memory 300a may be determined to be defective according to a signal output from the ECC engine 100a.

The error insertion circuit 200a may change the position of at least one bit error inserted in a test mode. For example, the error insertion circuit 200a may write the writing data D_WR generated by inserting at least one bit error into the encoded data D_ENC into a specific area of the memory 300a, and may output the reading data D_RD by reading data stored in the specific area of the memory 300a. Next, the error insertion circuit 200a may write the writing data D_WR including at least one bit error inserted into a position different from the previous position in the same encoded data D_ENC as before in the same area as the previous area of the memory 300a, and may read data stored in the same area as the previous area of the memory 300a, thereby outputting the reading data D_RD. When a real bit error actually caused by the memory 300a occurs in the bit error inserted by the error insertion circuit 200a, the bit error inserted by the error insertion circuit 200a cannot function as an error margin of the memory 300a. Accordingly, an operation of writing the generated writing data D_WR and outputting the reading data D_RD may be repeated while changing a position where the bit error is inserted for the same area and the same encoded data D_ENC. Examples of changing the position of a bit error by an error insertion circuit 200b will be described later below with reference to FIGS. 3A and 3B and FIG. 4.

Referring to FIG. 2B, the device 10b may include an ECC engine 100b, the error insertion circuit 200b, and a memory 300b. The error insertion circuit 200b may provide the reading data D_RD provided from the memory 300*b* in a normal mode to the ECC engine 100*b* as the receiving data D_RX, and/or may provide receiving data D_RX generated by inserting at least one bit error into the reading data D_RD to the ECC engine 100*b* in a test mode. The memory 300*b* may receive the writing data D_WR output from the ECC engine 100*b*. According to the example of FIG. 2B, the encoded data D_ENC and the writing data D_WR of FIG. 1 may coincide with each other in a test mode.

As described above with reference to FIG. 2B, the error insertion circuit 200*b* may change the position of at least one bit error inserted in a test mode. For example, the error insertion circuit 200*b* may provide the receiving data D_RX generated by inserting at least one bit error into the reading data D_RD output by reading an area in which the writing data D_WR is written to the ECC engine 100*b*. Thereafter, the error insertion circuit 200*b* may provide the ECC engine 100*b* with the receiving data D_RX including at least one bit error inserted at a different position from the previous position into the reading data D_RD output by reading the same area as before. In the device 10*a* of FIG. 2A, the reading data D_RD may be output a plurality of times by writing the writing data D_WR to an identical area a plurality of times according to the position of the bit error and reading the written data a plurality of times. However, in the device 10*b* of FIG. 2B, the reading data D_RD may be output a plurality of times by writing the writing data D_WR once to an identical area and reading the written data a plurality of times. Also, as will be described later below with reference to FIG. 6B, a read operation for an identical area of the memory 300*b* may be performed once in the device 10*b* of FIG. 2B.

Hereinafter, example embodiments of the inventive concepts will be mainly described with reference to an example in which the error insertion circuit 200*a* stores the writing data D_WR generated by inserting a bit error into the encoded data D_ENC in the memory 300*a* in a test mode, but are not limited thereto. The example embodiments of the inventive concepts may also be applied to a device including all of the device 10*b* of FIG. 2B and the error insertion circuits 200*a* and 200*b* of FIGS. 2A and 2B.

Figure 3A:
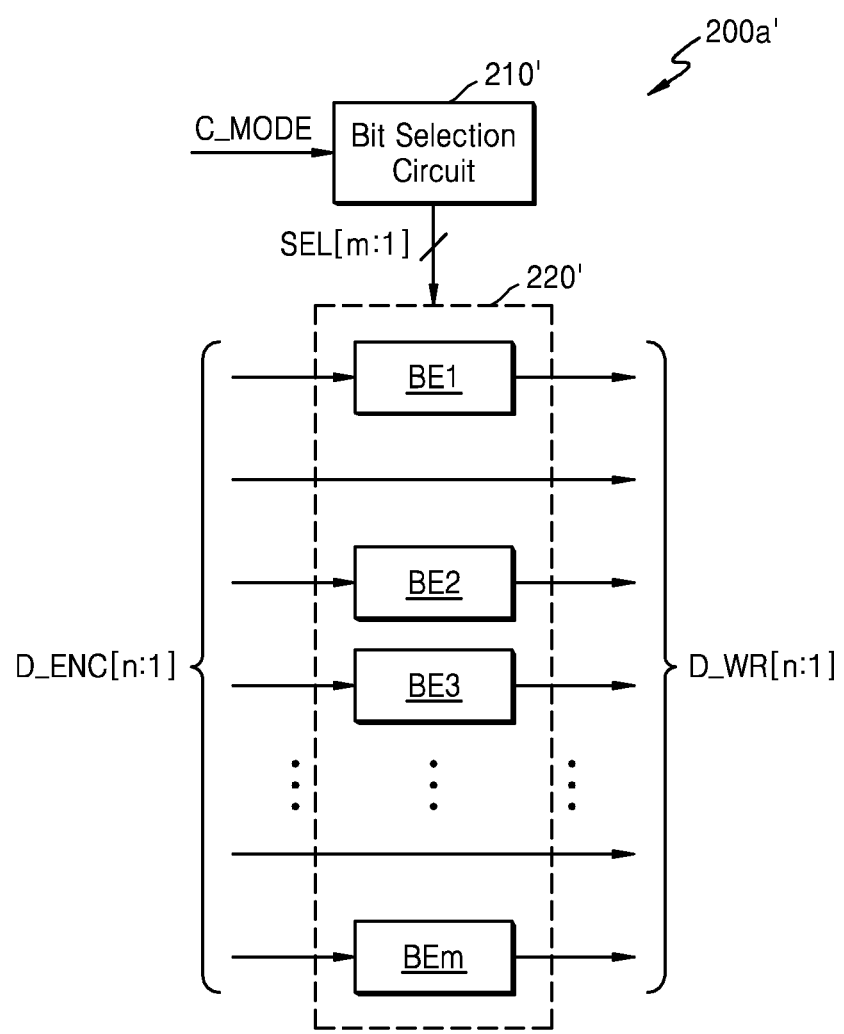
FIGS. 3A and 3B are block diagrams illustrating examples of an error insertion circuit of FIG. 1 according to an example embodiment of the inventive concepts.
Figure 3B:
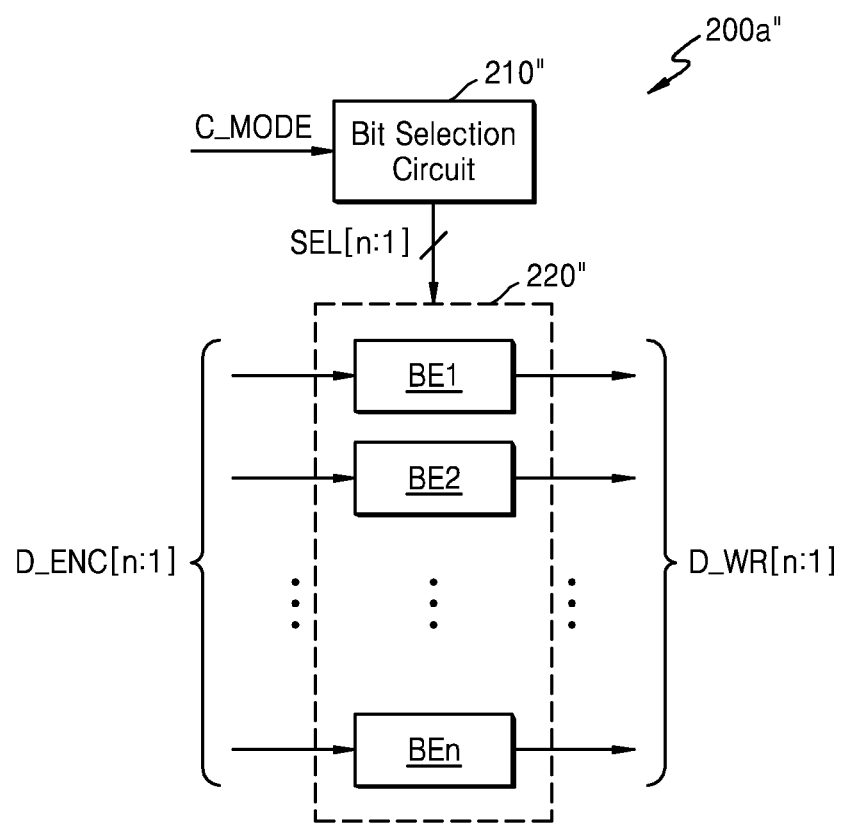

FIGS. 3A and 3B are block diagrams illustrating examples of the error insertion circuit 200 of FIG. 1 according to example embodiments of the inventive concepts. In more detail, FIGS. 3A and 3B illustrate examples of the error insertion circuit 200*a* of FIG. 2A. As described above with reference to FIG. 2A, error insertion circuits 200*a*' and 200*a*" of FIGS. 3A and 3B may insert at least one bit error into n-bit encoded data D_ENC in a test mode to generate n-bit writing data D_WR (n>0). Hereinafter, FIGS. 3A and 3B will be described with reference to FIG. 2A, and duplicate descriptions of FIGS. 3A and 3B will not be given herein.

Referring to FIG. 3A, the error insertion circuit 200*a*' may include a bit selection circuit 210' and m bit error circuits 220' (n>m>0). The m bit error circuits 220' may include a plurality of bit error circuits BE1 through BEm. The bit selection circuit 210' may receive the mode signal C_MODE and may provide up to m bits of selection signals SEL to the m bit error circuits 220', respectively. In response to the mode signal C_MODE indicating a normal mode, the bit selection circuit 210' may generate a selection signal SEL such that all of the m bit error circuits 220' are deactivated, that is, a bit signal of the encoded data D_ENC is directly output as a bit signal of the writing data D_WR. On the other hand, in response to the mode signal C_MODE indicating a test mode, the bit selection circuit 210' may generate the selection signal SEL such that at least one of the m bit error circuits 220' is activated, that is, a bit signal that is obtained by inverting the bit signal of the encoded data D_ENC is output as the bit signal of the writing data D_WR.

As illustrated in FIG. 3A, the m bit error circuits 220' may be arranged to be corresponding to m bits among n bits of the encoded data D_ENC. The arrangement of the m bit error circuits 220' shown in FIG. 3A is exemplary only, and the m bit error circuits 220' may be arranged, for example, in sequential m-bits D_ENC [n:n−m+1] from a most significant bit (MSB) of the encoded data D_ENC, or may be arranged in sequential m-bits D_ENC [m:1] from the MSB of the encoded data D_ENC, unlike that shown in FIG. 3A.

The bit selection circuit 210' may simultaneously activate bit error circuits of the number of bits corresponding to an error margin of the memory 300*a* from among the m bit error circuits 220' in a test mode. For example, if an error margin required in the memory 300*a* is one bit, the bit selection circuit 210' may activate one of m bit error circuits 220'. In addition, the bit selection circuit 210' may change a bit error circuit to be activated. For example, the bit selection circuit 210' may generate the selection signal SEL such that different K bit error circuits are activated when the same encoded data D_ENC is continuously written K times in an identical area of the memory 300*a*. As described later below with reference to FIG. 4, the number of times K in which the writing data D_WR generated from the same encoded data D_ENC is written in the identical area of the memory 300*a* may be determined based on the number of correctable bits of the ECC engine 100*a* and the error margin of the memory 300*a*.

Referring to FIG. 3B, the error insertion circuit 200*a*" may include a bit selection circuit 210" and n bit error circuits 220". That is, the error insertion circuit 200*a*" may include the n bit error circuits 220" corresponding to n bits of the encoded data D_ENC, respectively. The n bit error circuits 220" may include a plurality of bit error circuits BE1 through BEn. The bit selection circuit 210" may receive the mode signal C_MODE and may provide n bits of the selection signals SEL to the n bit error circuits 220", respectively. The bit selection circuit 210" may generate the selection signal SEL such that all of the n bit error circuits 220" are deactivated in response to the mode signal C_MODE indicating a normal mode. On the other hand, the bit selection circuit 210" may generate the selection signal SEL such that at least one of the n bit error circuits 220" is activated in response to the mode signal C_MODE indicating a test mode.

Figure 4:
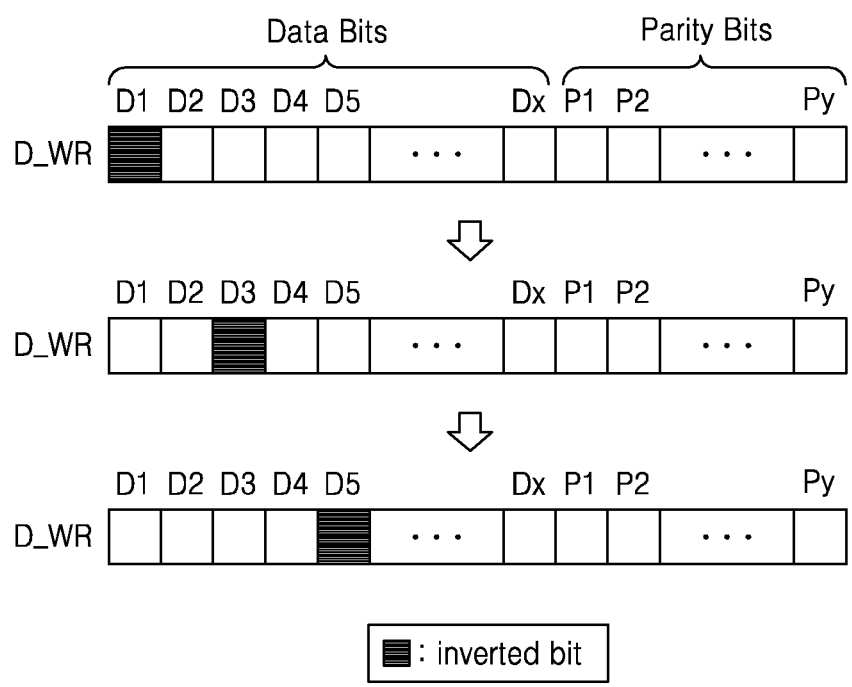
FIG. 4 is a view of examples of writing data of FIG. 2A in a test mode according to an example embodiment of the inventive concepts.

FIG. 4 is a view of examples of the writing data D_WR of FIG. 2A in a test mode according to an example embodiment of the inventive concepts. In more detail, FIG. 4 shows writing data D_WR generated from the same encoded data D_ENC and continuously written in the memory 300*a* of FIG. 2A. In the example of FIG. 4, the ECC engine 100*a* of FIG. 2A may correspond to a 2-bit correction ECC system, and an error margin required in the memory 300*a* may be 1 bit. Accordingly, the error insertion circuit 200*a* may generate the writing data D_WR in which 1-bit error is inserted by inverting 1 bit in the encoded data D_ENC. In FIG. 4, a shaded portion represents the bit inverted by the error insertion circuit 200*a*. Hereinafter, FIG. 4 will be described with reference to FIG. 2A.

The number of times K in which the writing data D_WR generated from the same encoded data D_ENC is written in the identical area of the memory 300*a* may be determined based on the number of correctable bits of the ECC engine 100*a* and the error margin of the memory 300*a*. As shown in the example of FIG. 4, when N is 2 and the error margin of the memory 300a is 1-bit, the memory 300a outputting the reading data D_RD including two or more real bit errors due to a defect in the memory 300a may be determined to be defective. When a bit error due to the error insertion circuit 200a is inserted into the same position as the real bit errors due to the defect in the memory 300a, an effect of inserting bit errors may be eliminated because the reading data D_RD includes less bit errors than the real bit errors since the real bit errors are corrected by the inserted bit error, or the inserted bit error and the real bit errors are included in the reading data D_RD as one bit error. Accordingly, in a process of the ECC engine 100a processing the reading data D_RD, errors of the reading data D_RD may be corrected normally and the memory 300a to be determined to be defective may be determined acceptable. In order to prevent a bit error inserted by the error insertion circuit 200a from being arranged in the same position as a real bit error, the error insertion circuit 200a may change a position where the bit error is inserted. In an example of FIG. 4, in order to determine that the memory 300a outputting the reading data D_RD including two real bit errors is defective, the error insertion circuit 200a may sequentially generate the writing data D_WR including bit errors at three different positions.

Referring to FIG. 4, the writing data D_WR may include x-bit number of data bits and y-bit number of parity bits (n=x+y), and the error insertion circuit 200a may insert a bit error by inverting the first data bit D1 of the data bits. The writing data D_WR obtained by inverting the first data bit D1 from the encoded data D_ENC may be written in the memory 300a, and the reading data D_RD may be provided to the ECC engine 100a by reading data stored in an area of the memory 300a in which the writing data D_WR is written.

The error insertion circuit 200a may then insert a bit error by inverting a third data bit D3 of the data bits. The writing data D_WR obtained by inverting the third data bit D3 from the encoded data D_ENC may be written in the memory 300a, and the reading data D_RD may be provided to the ECC engine 100a by reading data stored in the area of the memory 300a in which the writing data D_WR is written.

Finally, the error insertion circuit 200a may insert a bit error by inverting a fifth data bit D5 of the data bits. The writing data D_WR obtained by inverting the fifth data bit D5 from the encoded data D_ENC may be written in the memory 300a, and the reading data D_RD may be provided to the ECC engine 100a by reading data stored in the area of the memory 300a in which the writing data D_WR is written. It will be appreciated that positions where bit errors are inserted in FIG. 4 are only an example, and that bit errors may be inserted into any of three different positions.

When the n-bit correction ECC engine 100a is used and the error margin of the memory 300a is 1-bit, K, which is the number of repetitions of write and read operations for an identical area of the memory 300a, may coincide with n+1. In some example embodiments, if the number of bits of writing data or reading data is relatively great, that is, if a size of units of data processed by the ECC engine 100a are relatively great, it may be unlikely that all of bit errors inserted at different locations are at the same position as real bit errors. Therefore, the error insertion circuit 200a may perform less than three, for example, two write and read operations instead of performing three write and read operations. For example, in the example of FIG. 4, it may be unlikely that there are real bit errors in both the first data bit D1 and the third data bit D3, so that a test time of the memory 300a or the device 10a may be shortened by performing only two write and read operations.

Figure 5:
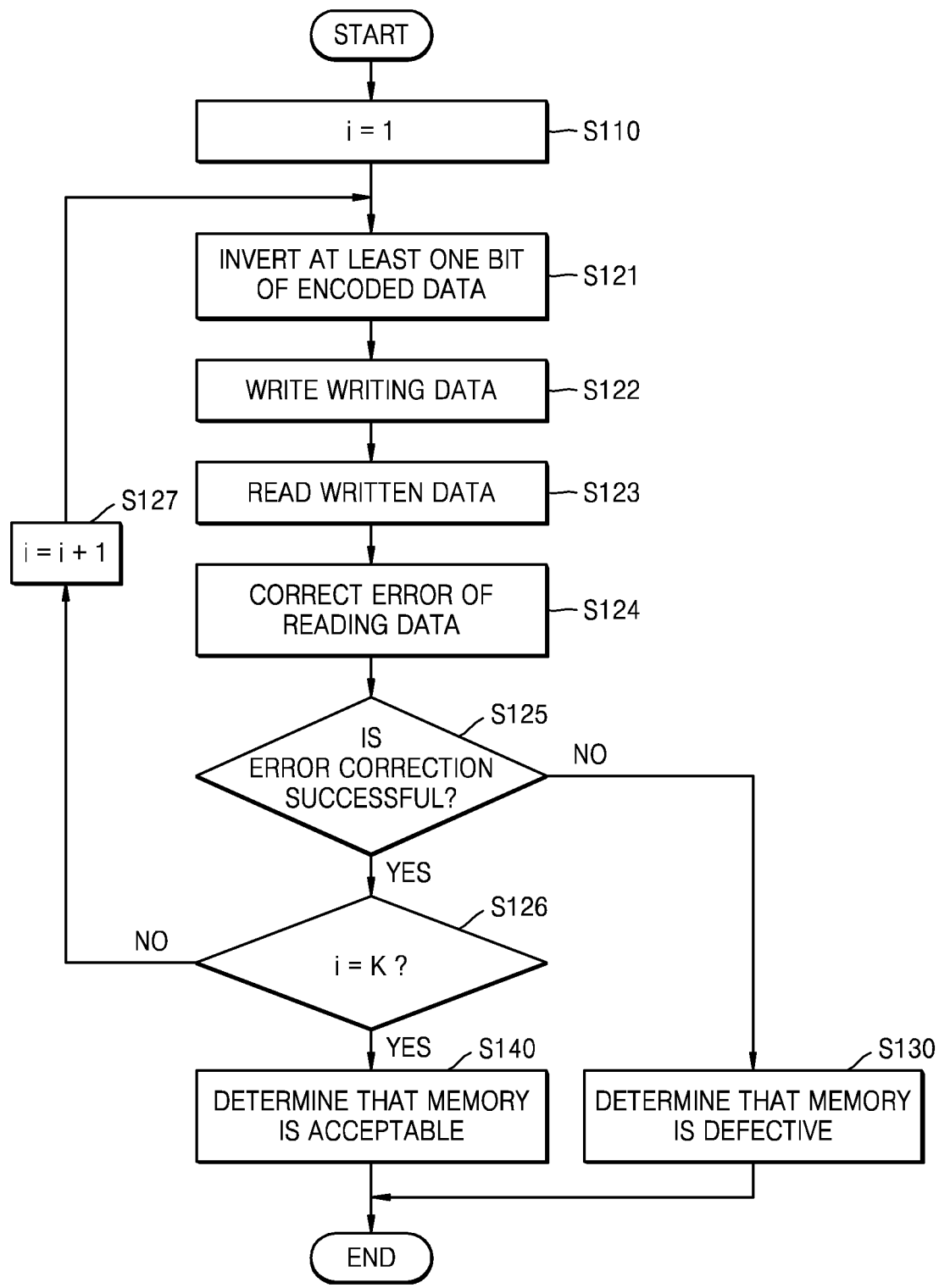
FIG. 5 is a flowchart illustrating a method of testing a device for supporting ECC, according to an example embodiment of the inventive concepts.

FIG. 5 is a flowchart illustrating a method of testing a device for supporting ECC, according to an example embodiment of the inventive concepts. In more detail, FIG. 5 shows a method of testing the device 10a of FIG. 2A in a test mode. Hereinafter, FIG. 5 will be described with reference to FIG. 2A.

In operation S110, an initialization operation may be performed. For example, as shown in FIG. 5, a variable i may be set to 1, and the variable i may indicate the number of operations performed to insert a bit error at different positions in the encoded data D_ENC, that is, the number of times a subsequent series of operations (S121 to S126) is performed.

In operation S121, an operation of inverting at least one bit of the encoded data D_ENC may be performed. For example, the error insertion circuit 200a may generate the writing data D_WR by inverting at least one bit of the encoded data D_ENC in response to the mode signal C_MODE indicating a test mode.

An operation of writing the writing data D_WR to the memory 300a may be performed in operation S122 and an operation of reading the data written from the memory 300a may be performed in operation S123. The reading data D_RD may be output from the memory 300a by reading data stored in the area of the memory 300a in which the writing data D_WR is written.

In operation S124, an error of the reading data D_RD may be corrected. For example, the ECC engine 100a may receive the reading data D_RD from the memory 300a and may correct an error in the reading data D_RD. Then, in operation S125, whether the error correction is successful or not may be determined. For example, the ECC engine 100a may have the number of correctable bits, and thus error correction of the reading data D_RD containing errors exceeding the number of correctable bits may fail. If the error correction fails, operation S130 may be performed subsequently, and an operation of determining that the memory 300a is defective may be performed in operation S130. On the other hand, if the error correction is successful, operation S126 may be performed subsequently.

In operation S126, whether the variable i is equal to K may be determined. That is, it may be determined whether write and read operations have been performed K times. As described above with reference to FIG. 4, K may be determined based on the correctable error amount of the ECC engine 100a and the error margin of the memory 300a. If the variable i is equal to K, operation S140 may be performed subsequently, and an operation of determining that the memory 300a is acceptable may be performed in operation S140. On the other hand, if the variable i is not equal to K, the variable i may increase by one in operation S127, and then operation S121 may be performed subsequently. In operation S121, a bit at a position different from a position of the previously inverted bit may be inverted.

Figure 6A:
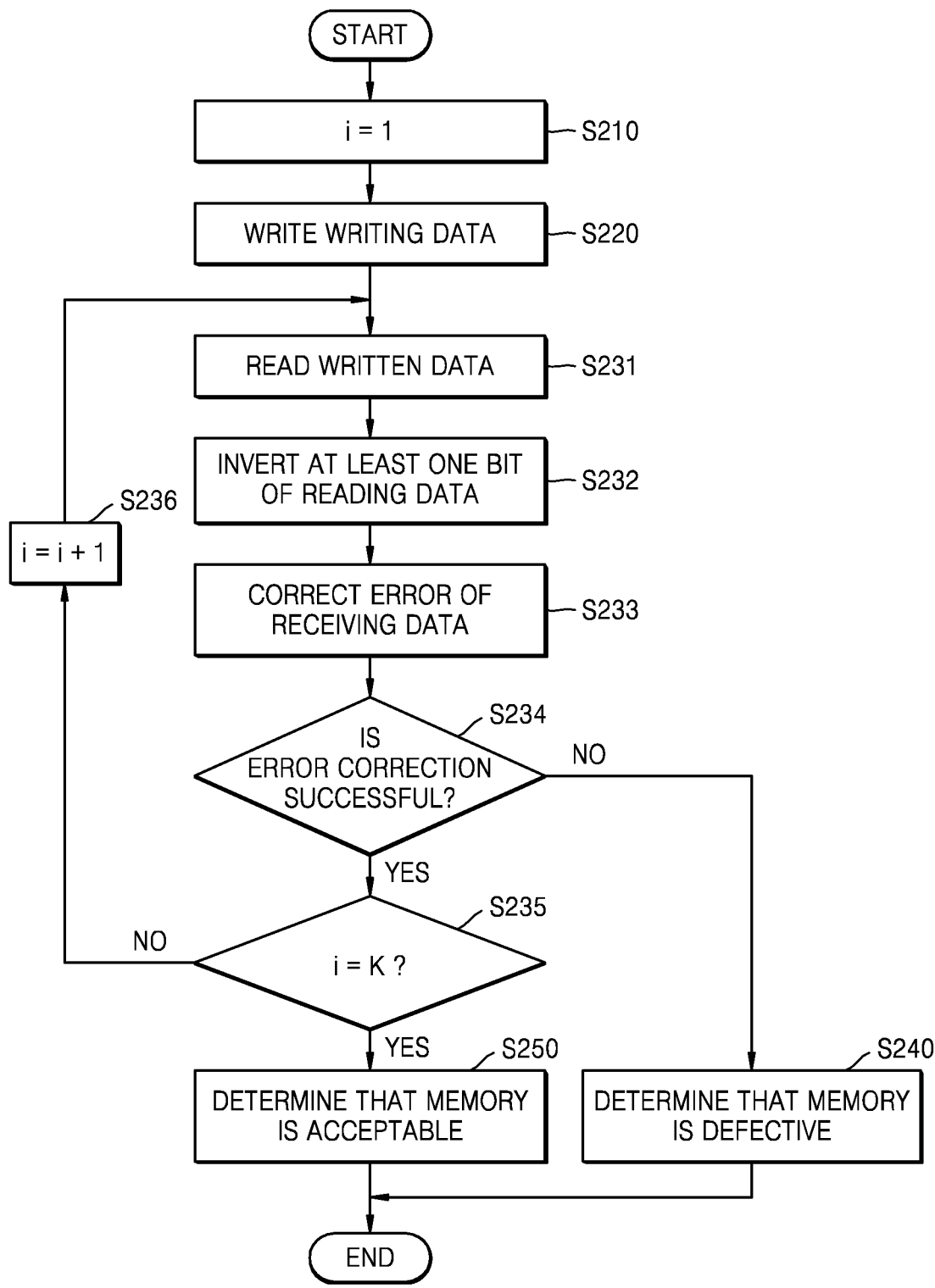
FIGS. 6A and 6B are flowcharts illustrating a method of testing a device for supporting ECC, according to an example embodiment of the inventive concepts.
Figure 6B:
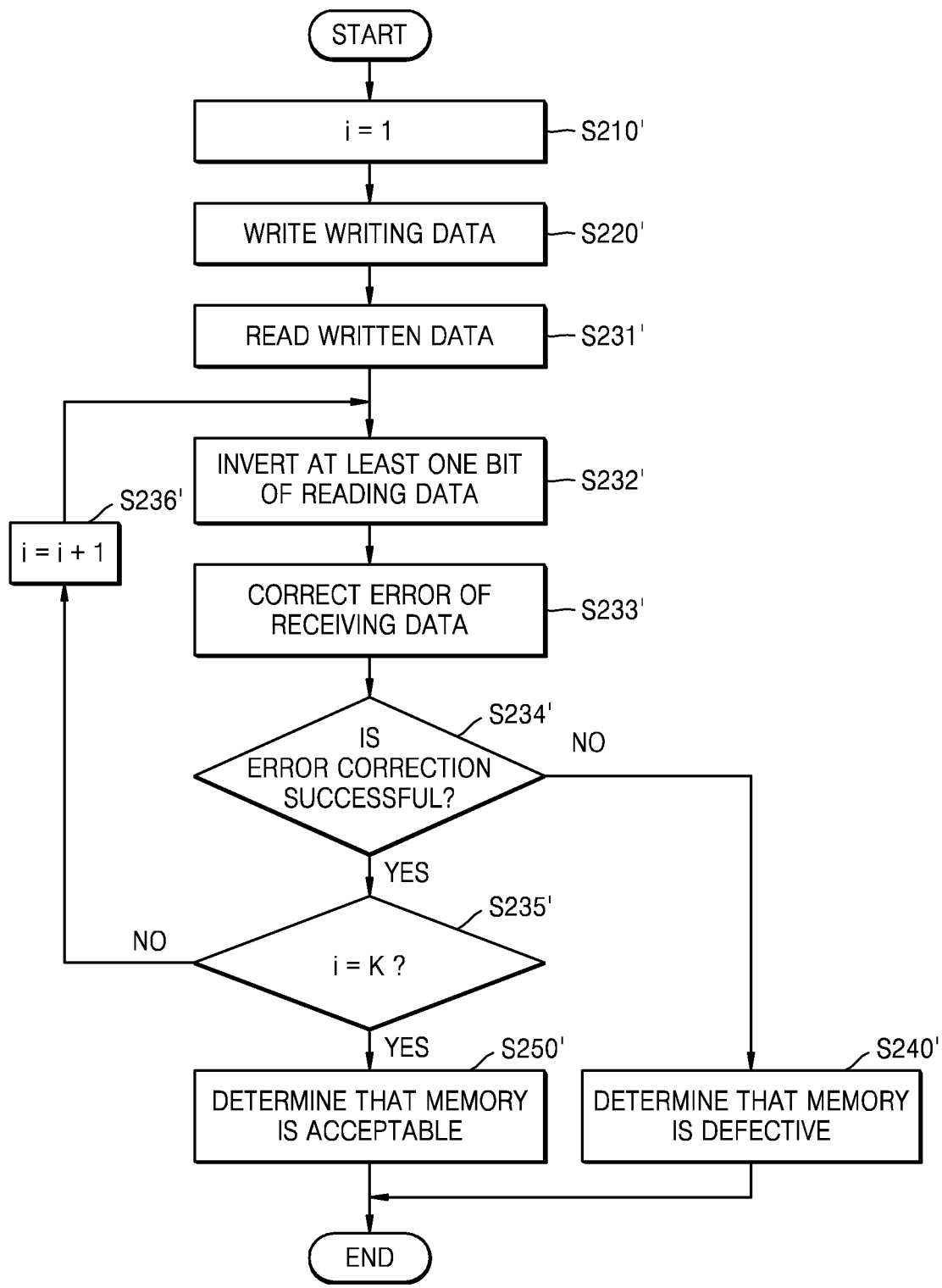

FIGS. 6A and 6B are flowcharts illustrating a method of testing a device for supporting ECC, according to an example embodiment of the inventive concepts. In more detail, FIGS. 6A and 6B show a method of testing the device 10b of FIG. 2B in a test mode. Hereinafter, FIGS. 6A and 6B will be described with reference to FIG. 2B. Furthermore, the same reference numerals as in FIG. 2B denote the same elements, and thus duplicate descriptions of FIGS. 6A and 6B will not be given herein.

Referring to FIG. 6A, in operation S210, an initialization operation may be performed. For example, as shown in FIG.

6A, the variable i may be set to 1, and the variable i may indicate the number of operations performed to insert a bit error at different positions in the reading data D_RD, that is, the number of times a series of operations (S231 to S235) is performed.

In operation S220, the writing data D_WR may be written. As illustrated in FIG. 6A, the writing data D_WR for verifying a specific area of the memory 300b may be written once, and an operation of outputting the reading data D_RD by reading the stored writing data D_WR may be repeated as described later below. As such, as compared with the example of FIG. 5, the number of write operations may be reduced in the example of FIGS. 6A and 6B, and thus the time taken to test the memory 300b may be relatively shortened.

In operation S231, the stored writing data D_WR may be read. The reading data D_RD may be output from the memory 300b by reading the data stored in the area of the memory 300b in which the writing data D_WR is written.

In operation S232, at least one bit of the reading data D_RD may be inverted. For example, the error insertion circuit 200b may generate the receiving data D_RX by inverting at least one bit of the reading data D_RD in response to the mode signal C_MODE indicating a test mode.

In operation S233, an error of the receiving data D_RX may be corrected. For example, the ECC engine 100b may receive the receiving data D_RX from the error insertion circuit 200b and may correct an error in the receiving data D_RX. Then, in operation S234, whether the error correction is successful or not may be determined. For example, the ECC engine 100b may have the number of correctable bits, and thus error correction of the receiving data D_RX containing errors exceeding the number of correctable bits may fail. If the error correction fails, operation S240 may be performed subsequently, and an operation of determining that the memory 300b is defective may be performed in operation S240. On the other hand, if the error correction is successful, operation S235 may be performed subsequently.

In operation S235, whether the variable i is equal to K may be determined. That is, it may be determined whether read operations have been performed K times. As described above with reference to FIG. 4, K may be determined based on the correctable error amount of the ECC engine 100b and the error margin of the memory 300b. If the variable i is equal to K, operation S250 may be performed subsequently, and an operation of determining that the memory 300b is acceptable may be performed in operation S250. On the other hand, if the variable i is not equal to K, the variable i may increase by one in operation S236, and then operation S231 may be performed subsequently. In operation S231, a bit at a position different from a position of the previously inverted bit may be inverted.

Referring to FIG. 6B, compared with the example of FIG. 6A, the write operation of the writing data D_WR may performed once to verify a specific area of the memory 300b, and the read operation of the stored writing data D_WR may also be performed once. That is, since the reading data D_RD output by repeatedly reading the stored writing data D_WR is identical, an operation of changing only the position of a bit error in the reading data D_RD by the error insertion circuit 200b may be repeated.

As illustrated in FIG. 6B, operations of FIG. 6B may be the same as or similar to the corresponding operations of FIG. 6A. However, if the variable i is not equal to K in operation S235' of FIG. 6B, the variable i may be increased by 1 in operation S236', and operation S232' may be performed instead of operation S231' subsequent to operation S236'. Therefore, the operation of writing the writing data D_WR in operation S220' and the operation of reading data written in operation S231' may be performed once each, and the operation of inverting at least one bit of the reading data D_RD may be repeated in operation S232'. Therefore, compared with the example of FIG. 6A, the number of read operations of the memory 300b may be reduced according to an example of FIG. 6B.

Figure 7A:
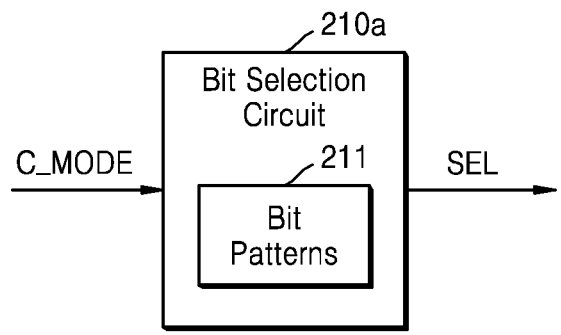
FIGS. 7A to 7C are block diagrams illustrating examples of bit selection circuits according to example embodiments of the inventive concepts.
Figure 7B:
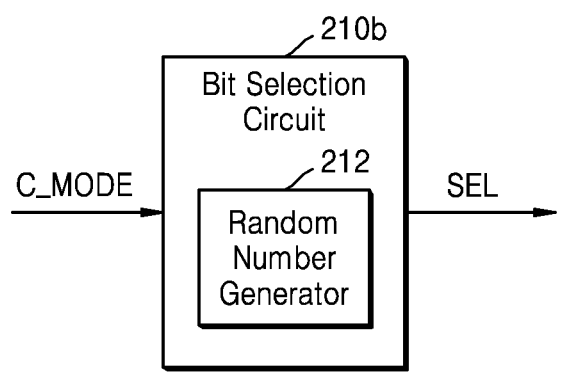
Figure 7C:
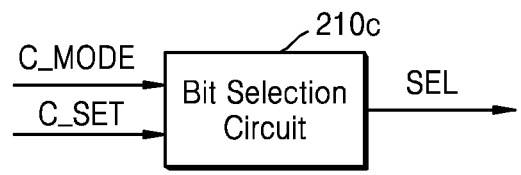

FIGS. 7A to 7C are block diagrams illustrating examples of bit selection circuits according to example embodiments of the inventive concepts. As described above with reference to FIGS. 3A and 3B, bit selection circuits 210a, 210b and 210c of FIGS. 7A to 7C may receive the mode signal C_MODE and may output the selection signal SEL. Hereinafter, FIGS. 7A to 7C will be described with reference to FIG. 1, and duplicate descriptions of FIGS. 7A to 7C will not be given herein.

Referring to FIG. 7A, the bit selection circuit 210a may include bit patterns 211. The bit selection circuit 210a may generate the selection signal SEL in response to the mode signal C_MODE indicating a test mode such that a bit error occurs at a position according to the bit patterns 211. For example, as described above with reference to FIG. 4, the bit patterns 211 may include three different patterns when bit errors are inserted in three different positions.

Referring to FIG. 7B, the bit selection circuit 210b may include a random number generator 212. In response to the mode signal C_MODE indicating a test mode, the bit selection circuit 210b may generate the selection signal SEL such that a bit error occurs at a position according to a random number generated by the random number generator 212. In some example embodiments, the random number generator 212 may be a pseudo random number generator.

Referring to FIG. 7C, the bit selection circuit 210c may further receive a setting signal C_SET. The setting signal C_SET may be generated from, for example, a signal received from the outside of the device 10 in FIG. 1, and may include setting information of the bit selection circuit 210c. In some example embodiments, the setting signal C_SET may determine the number of error-correcting operations, that is, K, for an identical area of the memory 300. For example, if the correctable error amount of the ECC engine 100 is fixed, K may be changed according to the setting signal C_SET to adjust an error margin of the memory 300. In addition, as described above with reference to FIG. 4, in order to shorten a test time, K may be, for example, changed according to the setting signal C_SET so as to be equal to or less than the number corresponding to the correctable error amount of the ECC engine 100.

Figure 8:
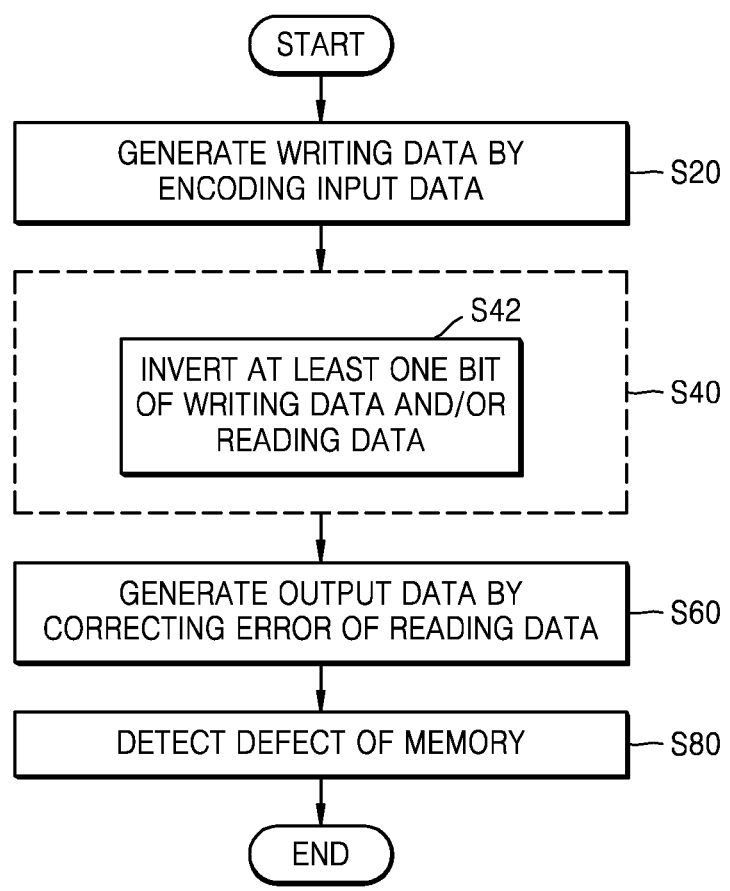
FIG. 8 is a flowchart illustrating a method of testing a device for supporting ECC, according to an example embodiment of the inventive concepts.

FIG. 8 is a flowchart illustrating a method of testing a device for supporting ECC, according to an example embodiment of the inventive concepts. For example, the method of FIG. 8 may represent a method of testing the device 10 of FIG. 1 in a test mode. In FIG. 8, the encoded data D_ENC and the writing data D_WR in FIG. 1 may be collectively referred to as writing data, and the reading data D_RD and the receiving data D_RX may be collectively referred to as reading data. For example, generating the writing data D_WR by inserting an error into the encoded data D_ENC in FIG. 1 may be referred to as inserting an error into writing data, and generating the receiving data D_RX by inserting an error into the reading data D_RD may be referred to as inserting an error into reading data. Hereinafter, FIG. 8 will be described with reference to FIG. 1.

In operation S20, writing data may be generated by encoding input data. For example, the ECC engine 100 of FIG. 1 may generate writing data by adding redundancy to the input data D_IN.

In operation S40, writing data may be written in the memory 300 and reading data may be output from the memory 300. For example, writing data may be written in a specific area of the memory 300, and reading data may be output by reading data stored in the area in which the writing data is written. The error insertion circuit 200 may insert an error into data to be written in the memory 300, that is, writing data, or may insert an error into data read from the memory 300, that is, reading data. Also, in some example embodiments, the error insertion circuit 200 may insert an error into both writing data and reading data. As illustrated in FIG. 8, operation S40 may include operation S42.

In operation S42, at least one bit of the writing data and/or the reading data may be inverted. For example, the error insertion circuit 200 may include the bit error circuit BE and may invert at least one bit of the writing data and/or the reading data by activating at least one bit error circuit BE. The deactivated bit error circuit BE may output an input bit signal.

In operation S60, the output data D_OUT may be generated by correcting an error of the reading data. For example, the ECC engine 100 of FIG. 1 may generate the output data D_OUT by correcting an error of the reading data.

In operation S80, a defect of the memory 300 may be detected. In some example embodiments, as described above with reference to FIG. 5 and the like, a defect in the memory 300 may be detected depending on whether or not the error correction is successful in operation S60. In some example embodiments, as described later below with reference to FIG. 9, a defect in the memory 300 may be detected based on the output data generated in operation S60.

Figure 9:
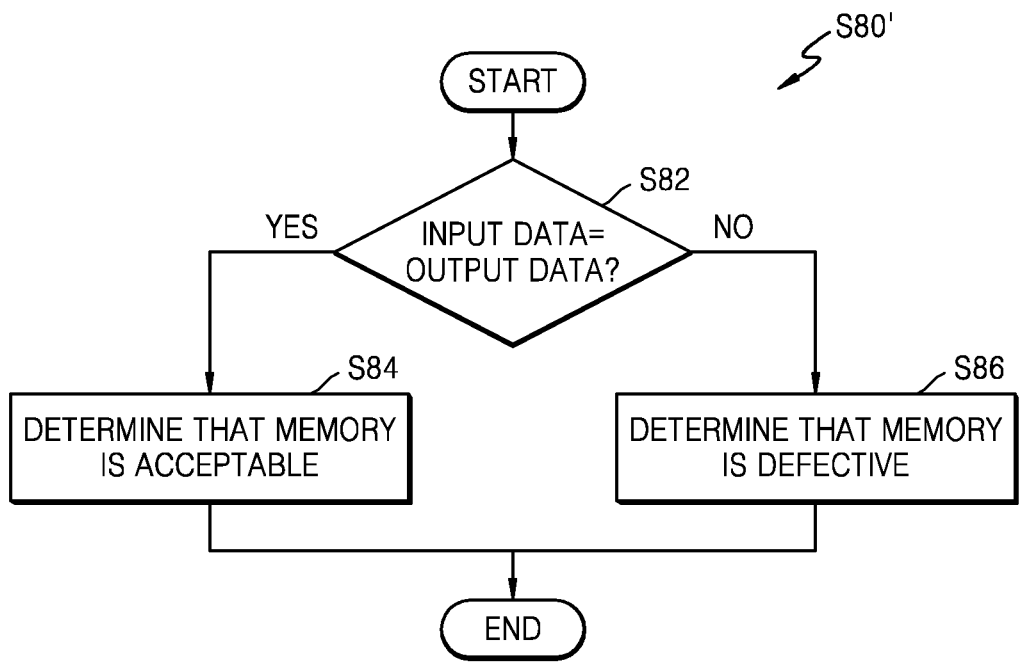
FIG. 9 is a flowchart illustrating an example of operation S80 of FIG. 8 according to an example embodiment of the inventive concepts.

FIG. 9 is a flowchart illustrating an example of operation S80 of FIG. 8 according to an example embodiment of the inventive concepts. As described above with reference to FIG. 8, a defect of a memory may be detected. As illustrated in FIG. 9, operation S80' may include a plurality of operations S82, S84, and S86, and FIG. 9 may be described with reference to FIGS. 1 and 8.

In some example embodiments, operation S80' may be performed by a test device that provides the input data D_IN to the device 10 outside the device 10 of FIG. 1 and receives the output data D_OUT. The test device may set the device 10 to a test mode using the mode signal C_MODE. It is possible to provide the input data D_IN to the device 10 set in a test mode and receive the output data D_OUT corresponding to the provided input data D_IN.

In operation S82, whether or not the input data D_IN and the output data D_OUT coincide with each other may be determined. For example, the test device may determine whether the input data D_IN provided to the device 10 and the corresponding output data D_OUT coincide with each other. The error corrected output data D_OUT may be received from data read from the memory 300 after the input data D_IN is stored in the memory 300 through an encoding process and the test device may compare the input data D_IN with the output data D_OUT. As described above with reference to drawings, an error may be inserted into data encoded from the input data D_IN and an error may be inserted into data read from the memory 300.

If the input data D_IN and the output data D_OUT coincide with each other despite the inserted error, the memory 300 may be determined to have a sufficient error margin and the memory 300 is accepted in operation S84.

On the other hand, if the input data D_IN and the output data D_OUT do not coincide with each other, the memory 300 may be determined to have a deficient error margin, and the memory 300 may be determined to be defective in operation S86.

Figure 10:
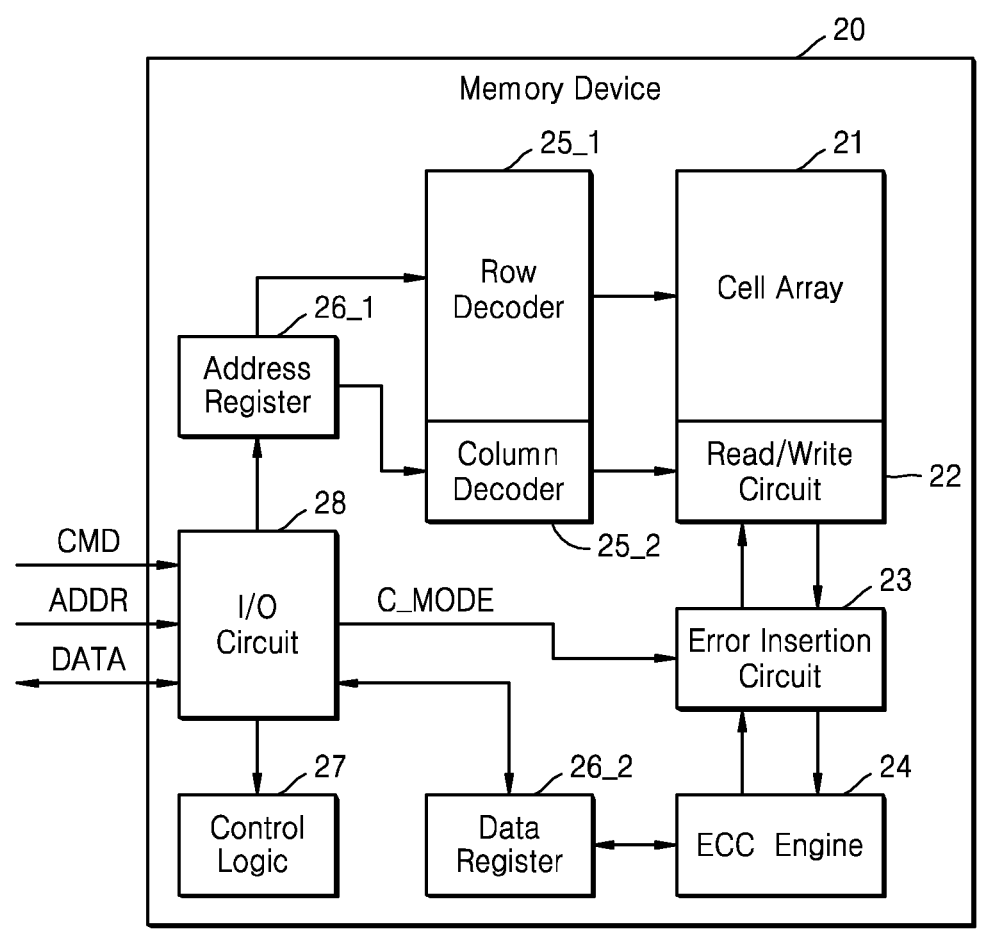
FIG. 10 is a block diagram illustrating an example of a device for supporting ECC, according to an example embodiment of the inventive concepts.

FIG. 10 is a block diagram illustrating an example of a device for supporting ECC, according to an example embodiment of the inventive concepts. In more detail, FIG. 10 shows a memory device 20 including a cell array 21 as a noisy channel.

The memory device 20 may receive a command CMD and an address ADDR, and may receive or transmit data DATA. For example, the memory device 20 may receive the command CMD such as a write command, a read command, and the like and the address ADDR corresponding to the command CMD from a memory controller. In addition, the memory device 20 may receive data DATA (i.e., input data) from the memory controller or provide data DATA (i.e., output data) to the memory controller. Although FIG. 10 separately shows the command CMD, the address ADDR, and the data DATA, in some example embodiments, at least two of the command CMD, the address ADDR, and the data DATA may be transmitted through an identical channel. As shown in FIG. 10, the memory device 20 may include the cell array 21, a read/write circuit 22, an error insertion circuit 23, an ECC engine 24, a row decoder 25_1, a column decoder 25_2, an address register 26_1, a data register 26_2, a control logic 27, and input/output circuit 28.

The cell array 21 may include a plurality of memory cells and may store data. An error in which data read from the cell array 21 by the read/write circuit 22 is different from data written in the cell array 21 may occur due to a defect included in the cell array 21. To correct the error, the ECC engine 24 may generate data by encoding the data DATA (i.e., input data) received along with the write command CMD, and may generate data DATA (i.e., output data) generated by correcting errors in data read from the cell array 21 in response to the read command CMD.

The error insertion circuit 23 may receive the mode signal C_MODE from the input/output circuit 28 and may insert an error into data transmitted between the read/write circuit 22 and the ECC engine 24 in response to the mode signal C_MODE indicating a test mode. Further, the error insertion circuit 23 may change a position of the error to be inserted. An error amount inserted by the error insertion circuit 23 may correspond to an error margin of the cell array 21. Thus, it can be easily verified whether or not the cell array 21 has a sufficient error margin, and consequently, a defect in the memory device 20 may be easily detected.

The row decoder 25_1 may activate at least one of a plurality of word lines connected to the cell array 21 according to a row address provided from the address register 26_1. The column decoder 25_2 may select some of signals output from memory cells connected to the activated word line according to a column address provided from the address register 26_1.

The address register 26_1 may receive and store the address ADDR from the input/output circuit 28. The data register 26_2 may store data received from the input/output circuit 28 and may provide the stored data to the ECC engine 24. In addition, the data register 26_2 may store data received from the ECC engine 24 and may provide the stored data to the input/output circuit 28.

The control logic 27 may generate control signals for an operation of the memory device 20 according to the command CMD received by the input/output circuit 28, and the control signals may be provided to components included in the memory device 20, respectively.

The input/output circuit 28 may receive the command CMD, the address ADDR, and the data DATA from the outside of the memory device 20 and output the data DATA. In some example embodiments, the input/output circuit 28 may decode the command CMD and provide a result of the decoding to the control logic 27.

Figure 11:
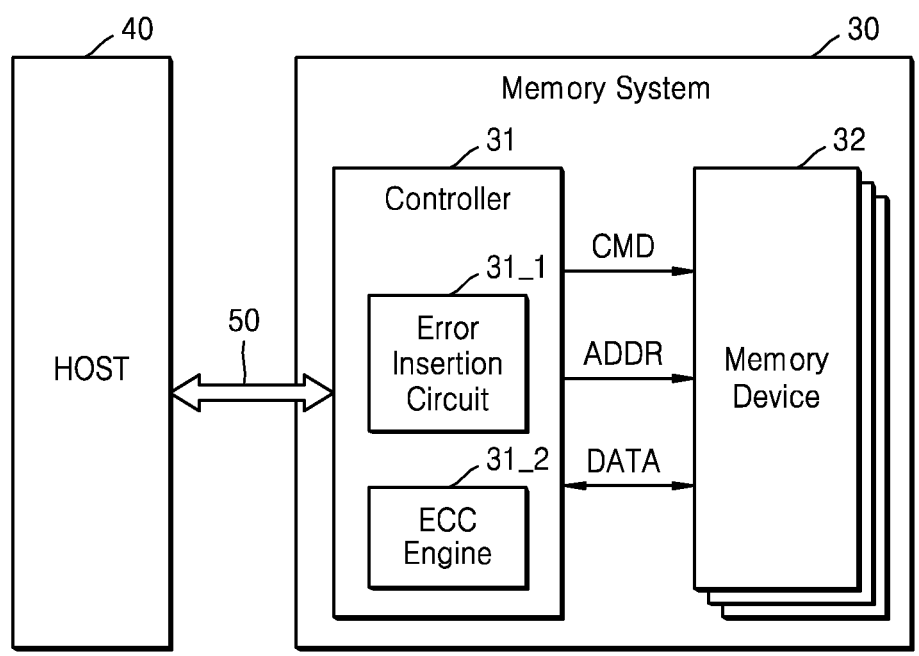
FIG. 11 is a block diagram illustrating an example of a device for supporting ECC, according to an example embodiment of the inventive concepts.

FIG. 11 is a block diagram illustrating an example of a device for supporting ECC, according to an example embodiment of the inventive concepts. In more detail, FIG. 11 shows a memory system 30 including a memory device 32 as a noisy channel and a host 40 communicating therewith.

The memory system 30 may communicate with the host 40 via an interface 50. The interface 50 through which the memory system 30 and the host 40 communicate with each other may use an electrical and/or optical signal, and may implemented by, but is not limited to, a serial advanced technology attachment (SATA) interface, an SATA express (SATAe) interface, a serial attached small computer system interface (SAS), a peripheral component interconnect express (PCIe) interface, a nonvolatile memory-express (NVMe) interface, an advanced host controller interface (AHCI), or a combination thereof.

In some example embodiments, the memory system 30 may communicate with the host 40 by being removably coupled to the host 40. The memory device 32 may be a nonvolatile memory as a resistive memory, and the memory system 30 may be referred to as a storage system. For example, the memory system 30 may be implemented by, but is not limited to, a solid-state drive or solid-state disk (SSD), an embedded SSD (eSSD), a multimedia card (MMC), an embedded multimedia card (eMMC), and the like.

As illustrated in FIG. 11, the memory system 30 may include a controller 31 and at least one memory device 32. The at least one memory device 32 may receive the command CMD and the address ADDR received from the controller 31 and may receive or transmit the data DATA.

The controller 31 may control at least one memory device 32 in response to a request received from the host 40 through the interface 50. For example, the controller 31 may write data in received with a write request in the at least one memory device 32 in response to the write request, or may provide data stored in the at least one memory device 32 to the host 40 in response to the read request. As shown in FIG. 11, the controller 31 may include an error insertion circuit 31_1 and an ECC engine 31_2.

In some example embodiments, the error insertion circuit 31_1 may insert an error into data obtained by encoding data requested to be written from the host 40 in a test mode by the ECC engine 31_2, and may provide the error-inserted data to the at least one memory device 32 as writing data. In some example embodiments, the error insertion circuit 31_1 may insert an error into data read from the at least one memory device 32 in response to a read request of the host 40 in a test mode, and may provide the error-inserted data to the ECC engine 31_2. Further, the error insertion circuit 31_1 may change a position of the error to be inserted. An error amount inserted by the error insertion circuit 31_1 may correspond to an error margin of the at least one memory device 32. Thus, it can be easily verified whether or not the at least one memory device 32 has a sufficient error margin.

While the inventive concepts has been particularly shown and described with reference to example embodiments thereof, it will be understood that various changes in form and details may be made therein without departing from the spirit and scope of the following claims.

What is claimed is:

1. A device for supporting a test mode for memory testing, the device comprising:
a memory configured to receive and store writing data and output reading data from the stored writing data;
an error correction code (ECC) engine configured to generate the writing data by encoding input data and to generate output data by correcting error bits of N bits or less included in receiving data when N is a positive integer; and
an error insertion circuit configured to provide the reading data to the ECC engine as the receiving data in a normal mode and to provide data obtained by inverting at least one bit of less than N bits of the reading data to the ECC engine as the receiving data in the test mode.

2. The device of claim 1, wherein the error insertion circuit is further configured to change a position of the at least one bit in the reading data that is continuously output from the memory K times when K is an integer equal to or greater than 2 in the test mode.

3. The device of claim 1, wherein the error insertion circuit is further configured to change the position of the at least one bit such that positions of bits inverted in the reading data that is continuously output from the memory K times in the test mode are different from each other.

4. The device of claim 2, wherein K is equal to (N+1).

5. The device of claim 2, wherein K is equal to or less than N and is determined based on the size of data processed by the ECC engine.

6. The device of claim 2, wherein the error insertion circuit is further configured to determine K according to a setting signal received from outside of the device.

7. The device of claim 2, wherein the error insertion circuit is further configured to change the position of the at least one bit according to K bit patterns.

8. The device of claim 2, wherein the error insertion circuit is further configured to change the position of the at least one bit according to a random number generated each time the error insertion circuit is read.

9. The device of claim 1, wherein the error insertion circuit is further configured to invert one bit of the reading data in the test mode.

10. The device of claim 1, wherein the memory comprises a cell array comprising a plurality of memory cells, and
the device is a memory device configured to receive the input data or output the output data in response to a command and an address received externally.

11. The device of claim 1, wherein the memory is a memory device configured to receive a command and an address, and
the device is a memory system configured to receive the input data or output the output data in response to a request received externally.

12. A device for supporting a test mode for memory testing, the device comprising:
a memory configured to receive and store writing data and output reading data from the stored writing data;
an error correction code (ECC) engine configured to generate encoded data by encoding input data and to generate output data by correcting error bits of N bits or less included in the reading data when N is a positive integer; and
an error insertion circuit configured to provide the encoded data to the memory as the writing data in a normal mode and to provide data obtained by inverting at least one bit of less than N bits of the encoded data to the memory as the writing data in the test mode, wherein the error insertion circuit is further configured to change a position of the at least one bit in the encoded data that is continuously written in the memory K times when K is an integer equal to or greater than 2 in the test mode.

13. The device of claim 12, wherein the error insertion circuit is further configured to change the position of the at least one bit such that positions of bits inverted in the encoded data that is continuously written in the memory K times in the test mode are different from each other.

14. A method of testing a device comprising an error correction code (ECC) engine and a memory configured to correct error bits of N bits or less when N is a positive integer, the method comprising:
   generating writing data by encoding input data by the ECC engine;
   writing the writing data in the memory, reading the writing data, and outputting reading data; and
   generating output data by correcting an error of the reading data by the ECC engine, wherein
   the writing of the writing data and the outputting of the reading data comprises inverting at least one bit of less than N bits in at least one of the writing data and the reading data, wherein the inverting of the at least one bit comprises inverting at least one bit of less than N bits in the reading data, and changing a position of the at least one bit in reading data that is continuously output from the memory K times when K is an integer equal to or greater than 2.

15. The method of claim 14, wherein the inverting of the at least one bit comprises:
   inverting at least one bit of less than N bits in the writing data; and
   changing a position of the at least one bit in the writing data that is written continuously in the memory K times when K is an integer equal to or greater than 2.

16. The method of claim 14, further comprising:
   detecting a defect of the memory based on the input data and the output data.

17. The method of claim 14, wherein the generating of the output data comprises detecting, by the ECC engine, whether a correction of error bits in the reading data is successful, and
   detecting a defect of the memory based on whether or not the correction is successful.

18. The method of claim 14, further comprising:
   receiving a setting signal indicating an entry of a test mode, and
   the inverting of the at least one bit is performed in the test mode.

* * * * *